United States Patent
Azuma et al.

(10) Patent No.: US 10,357,927 B2
(45) Date of Patent: Jul. 23, 2019

(54) LIGHT EMITTING DEVICE AND METHOD FOR MANUFACTURING THE SAME

(71) Applicant: NICHIA CORPORATION, Anan-shi, Tokushima (JP)

(72) Inventors: Teruhito Azuma, Anan (JP); Toru Hashimoto, Tokushima (JP); Tadao Morino, Anan (JP)

(73) Assignee: NICHIA CORPORATION, Anan-Shi (JP)

(*) Notice: Subject to any disclaimer, the term of this patent is extended or adjusted under 35 U.S.C. 154(b) by 58 days.

(21) Appl. No.: 15/169,115

(22) Filed: May 31, 2016

(65) Prior Publication Data
US 2016/0348876 A1   Dec. 1, 2016

(30) Foreign Application Priority Data
Jun. 1, 2015 (JP) .................. 2015-111516

(51) Int. Cl.
| | |
|---|---|
| *B29D 11/00* | (2006.01) |
| *H01L 33/56* | (2010.01) |
| *H01L 33/60* | (2010.01) |
| *B29L 11/00* | (2006.01) |
| *B29K 105/16* | (2006.01) |

(52) U.S. Cl.
CPC .......... *B29D 11/0074* (2013.01); *H01L 33/56* (2013.01); *H01L 33/60* (2013.01); *B29K 2105/16* (2013.01); *B29L 2011/0083* (2013.01); *H01L 2933/005* (2013.01)

(58) Field of Classification Search
USPC ........................................ 362/297
See application file for complete search history.

(56) References Cited

U.S. PATENT DOCUMENTS

| | | | |
|---|---|---|---|
| 2011/0018017 A1* | 1/2011 | Bierhuizen | H01L 33/46 257/98 |
| 2012/0261699 A1 | 10/2012 | Ooyabu et al. | |
| 2013/0188381 A1 | 7/2013 | Kotani | |

(Continued)

FOREIGN PATENT DOCUMENTS

| | | |
|---|---|---|
| JP | 2010-192629 A | 9/2010 |
| JP | 2010-283281 A | 12/2010 |
| JP | 2012-134355 A | 7/2012 |

(Continued)

*Primary Examiner* — Rafferty D Kelly
(74) *Attorney, Agent, or Firm* — Foley & Lardner LLP

(57) ABSTRACT

A light emitting device includes a light emitting element having an upper face and lateral faces; a light transmissive member covering at least a portion of the upper face of the light emitting element and transmitting light emitted from the light emitting element; a first reflector covering at least a portion of lateral faces of the light transmissive member; and a second reflector covering the lateral faces of the light emitting element. The first reflector includes a first bottom face and a second bottom face. A plane in which the first bottom face of the first reflector extends is different than a plane in which a lower face of the light transmissive member extends. The second bottom face of the first reflector is located inward of the first bottom face of the first reflector, and is coplanar with the lower face of the light transmissive member. The first bottom face of the first reflector is covered by and in contact with the second reflector.

11 Claims, 7 Drawing Sheets

(56) References Cited

U.S. PATENT DOCUMENTS

2014/0001949 A1    1/2014   Kimura et al.

FOREIGN PATENT DOCUMENTS

| JP | 2012-222315 A | 11/2012 |
| JP | 2012-227470 A | 11/2012 |
| JP | 2012-533902 A | 12/2012 |
| JP | 2013-149906 A | 8/2013 |
| JP | 2014-168034 A | 9/2014 |
| WO | WO-2014/081042 A1 | 1/2017 |

* cited by examiner

L IGHT EMITTING DEVICE AND METHOD FOR MANUFACTURING THE SAME

CROSS-REFERENCE TO RELATED APPLICATIONS

The present application claims priority under 35 U. S. C. § 119 to Japanese Patent Application No. 2015-111516, filed Jun. 1, 2015. The contents of this application are incorporated herein by reference in their entirety.

BACKGROUND

The present disclosure relates to light emitting devices and methods for producing the same.

Surface mount type light emitting devices using a package for housing a light emitting element have been widely used. Since a surface mount type light emitting device is prepared by mounting a light emitting element in a separately prepared package, the extent of size reduction has been restricted by the package size. Accordingly, light emitting devices in which the lateral faces of a light emitting element are covered by a reflector, in lieu of a package, have been proposed (see, for example, Japanese Unexamined Patent Application Publication No. 2012-227470 ("JP '470")).

SUMMARY

A light emitting device according to one embodiment of the invention includes a light emitting element having an upper face and lateral faces; a light transmissive member covering at least a portion of the upper face of the light emitting element and transmitting the light emitted from the light emitting element; a first reflector retaining the light transmissive member; and a second reflector covering the lateral faces of the light emitting element, wherein the first reflector has a bottom face positioned on a different plane from the lower face of the light transmissive member, and the bottom face is in contact with the second reflector.

A method for producing the light emitting device according to one embodiment of the invention is a method for producing the light emitting device having a light emitting element, a light transmissive member covering at least a portion of the upper face of the light emitting element, a first reflector disposed to surround the light transmissive member, and a second reflector covering the lateral faces of the light emitting element. The method includes a baseplate preparation step for preparing a baseplate having a plate surface on which a protrusion is provided in the area corresponding to the position where the light emitting element will be disposed; a first resin frame forming step for forming on the plate surface a first resin frame for the first reflector having an opening on the protrusion; a second resin coating step for filling the opening with a second resin for the light transmissive member; a baseplate detaching step for detaching the baseplate; a light emitting element bonding step for bonding the light emitting element to the second resin surface exposed as a result of detaching the baseplate; and a third resin coating step for applying a third resin for the second reflector which surrounds the lateral faces of the light emitting element and is in contact with the first resin layer.

DESCRIPTION

Figure 1:
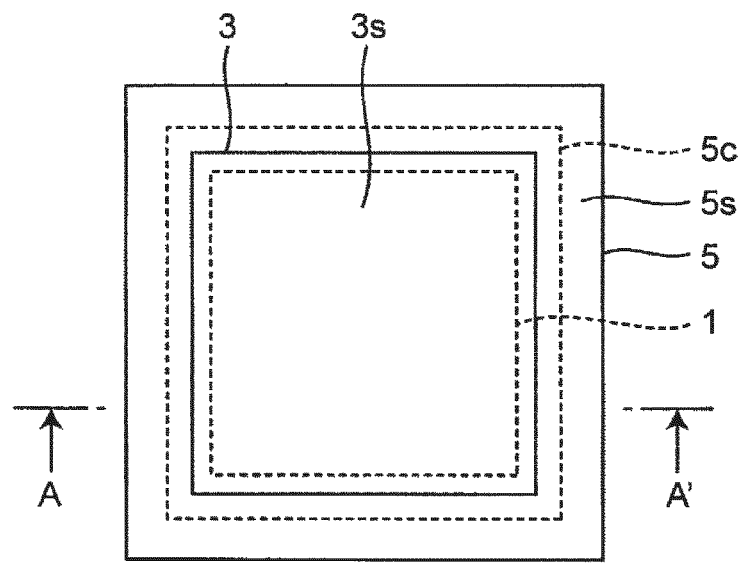
FIG. 1 is a schematic top view of the light emitting device according to Embodiment 1.

Embodiments of the present invention will be explained in detail below based on drawings. In the explanations below, terms indicating certain directions and positions will be used as needed (for example, "upper," "lower," "right," "left," and other terms including these). These terms are used for the purpose of making the invention easily understood based on the drawings being referred to, and the technical scope of the invention should not be limited by the meanings of these terms. The portions denoted by the same reference numerals appearing in multiple drawings represent the same portions or components.

In the light emitting device disclosed in JP '470, the lateral faces of the phosphor sheet are not covered by the reflector, and thus exposed, once the light emitting devices are separated into individual pieces. Thus, the outline of the light emitting portion is blurred, resulting in poor visibility (that is, there is no clear distinction between the light emitting portion and the non-emitting portion).

Accordingly, an object of certain embodiments of the invention is to provide a light emitting device having a clearly defined light emitting portion and a method for producing the same.

According to the light emitting device and the production method according to the embodiments of the invention described above, a light emitting device having a clearly defined light emitting portion and a method for producing the same can be provided.

Light Emitting Device According to Embodiment 1

Figure 2:
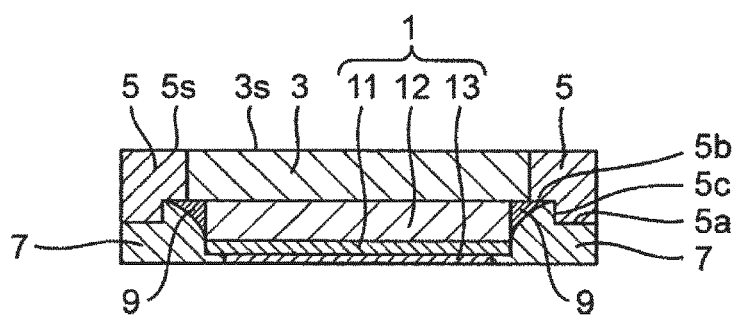
FIG. 2 is a schematic sectional view along line A-A' indicated in FIG. 1.
Figure 3:
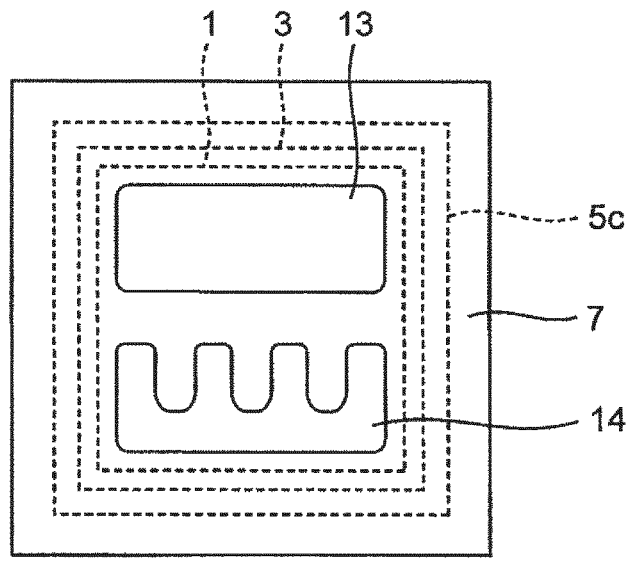
FIG. 3 is a schematic bottom view of the light emitting device according to Embodiment 1.

FIG. 1 is a schematic top view of the light emitting device according to Embodiment 1 of the present invention, FIG. 2 is a schematic sectional view along line A-A' indicated in FIG. 1, and FIG. 3 is a schematic bottom view of the light emitting device according to Embodiment 1.

The light emitting device according to Embodiment 1 includes: a light emitting element 1 which has an upper face as the emission face and electrodes 13 and 14 disposed on its lower face opposite the emission face; a light transmissive member 3 disposed on the emission face of the light emitting element 1; a first reflector 5 disposed to surround the light transmissive member 3; and a second reflector 7 disposed to surround the light emitting element 1.

In the light emitting device according to Embodiment 1, the light emitting element 1 includes, for example, a light transmittive substrate 12 positioned on the emission face side, and a semiconductor stack 11 disposed on the face of the light transmittive substrate 12 opposite the emission face, wherein the electrodes 13 and 14 are formed on the surface of the semiconductor stack 11. The semiconductor stack 11 includes, for example, an n-type semiconductor layer and a p-type semiconductor layer wherein the electrode 13 is connected to one of the n-type semiconductor layer and the p-type semiconductor layer, and the electrode 14 is connected to the other of the n-type semiconductor layer and the p-type semiconductor layer. The semiconductor stack 11 may further include an emission layer between the n-type semiconductor layer and the p-type semiconductor layer.

In the light emitting device according to Embodiment 1, the light transmissive member 3 is disposed so that its lower lace opposes the emission face of the light emitting element 1 to cover at least a portion of the emission face of the light emitting element 1, and the light emitted by the light emitting element is ejected after passing through the light transmissive member 3. In the light emitting device of Embodiment 1, the light transmissive member 3 is preferably disposed to cover substantially the entire emission face of the light emitting element 1, more preferably disposed, as shown in FIG. 1, so as to cover the entire emission face of the light emitting element 1, and its outer circumferential faces (outer lateral faces) are positioned outside the outer lateral faces of the light emitting element 1. The surface 3s, which is the upper face of the light transmissive member 3, makes up a portion of the upper face of the light emitting device as the light ejecting face. The light transmissive member 3 may contain a wavelength converting substance for converting the light emitted by the light emitting element 1 into light having a different wavelength.

In the light emitting device of Embodiment 1, the first reflector 5 is disposed to surround the light transmissive member 3, preferably in contact with the light transmissive member 3 to reduce light leakage from the lateral faces of the light transmissive member 3 and retain the light transmissive member 3. The first reflector 5 is preferably disposed in contact with the entire lateral faces of the light transmissive member 3, thereby effectively reducing light leakage from the lateral faces of the light transmissive member 3 and securely retaining the light transmissive member 3.

In the light emitting device according to Embodiment 1, the boundary between the light ejecting face made of the surface 3s and the non-ejecting face made of the surface 5s at the upper face of the light emitting device can be defined clearly by the surface 5s of the first reflector 5, for example, makes up a portion of the upper face of the light emitting device by surrounding the surface 3s which is the upper face of the light transmitting member 3.

Moreover, the first reflector 5 has a first bottom face 5a positioned lower than the lower face of the light transmissive member 3, creating a difference in level with the second bottom face 5b which is substantially coplanar with the lower face of the light transmissive member 3, such as that shown in FIG. 2. In the light emitting device of Embodiment 1, the lower face of the light transmissive member 3 and the second bottom face 5b, which are substantially coplanar, form the mounting face for mounting the light emitting element 1, and the emission face of the light emitting element 1 is bonded to the mounting face by a die bonding resin so as to oppose the lower face of the light transmissive member 3. This can form a die bonding resin on the inside of the inner circumferential faces 5c of the first reflector 5, which are positioned between the first bottom face 5a and the second bottom face 5b, along the lateral faces of the light emitting element 1. The die bonding resin has oblique portions 9 as its oblique lateral faces spread out from the lateral faces of the light emitting element 1 towards the light transmissive member 3. The die bonding resin preferably is a light transmissive resin because light needs to transmit through the die bonding resin formed between the light emitting element 1 and the light transmissive member 3. The light transmissive resin layer formed between the light emitting element 1 and the light transmissive member 3 is formed to a thickness, for example, in a range between about 2 µm and about 30 µm, preferably in a range between about 4 µm and about 20 µm, more preferably in a range between about 5 µm and about 10 µm. Here, the oblique portions 9 are formed with the die bonding resin, but the oblique portions 9 may be formed using another light transmissive resin separate from the die bonding resin.

In the light emitting device according to Embodiment 1, the second reflector 7 is disposed to cover the light emitting element 1, and surfaces of the electrodes 13 and 14 are exposed for external connection of the light emitting device. The second reflector 7 is disposed so as to cover and be in contact with the first bottom face 5a of the first reflector 5, and the light emitting element 1 is protected by both the second reflector 7 and the first reflector 5. The second reflector 7 is preferably formed in contact with the portion of the first reflector 5 having the difference in level, i.e., the inner circumferential faces of the first reflector 5 and a surface of the die bonding resin, in addition to the first bottom face 5a of the first reflector 5. This can enhance the bonding strength between the first reflector 5 and the second reflector 7. When the oblique portions 9 are formed with a light transmissive resin, the light ejected from the lateral faces of the light emitting element 1 can be reflected at the interfaces between the oblique portions 9 and the second reflector 7 to be extracted through the light transmissive member 3, thereby increasing the light extraction efficiency. The bottom face of the second reflector 7 is formed substantially flat, and the surfaces of the electrodes 13 and 14 are exposed at the bottom face. In the light emitting device of Embodiment 1, the bottom face of the second reflector 7, where the surfaces of the electrodes 13 and 14 are exposed, serves as the mounting face of the light emitting device.

The light emitting device of Embodiment 1 described above can be made compact as it is structured to protect the light emitting element 1 with the second reflector 7 and the first reflector 5 without employing a separately prepared package.

The light emitting device of Embodiment 1 described above can configure the surface 5s of the first reflector 5 to surround the surface 3c of the light transmissive member 3, which is the light ejecting face, thereby clearly defining the boundary between the light ejecting face and the non-ejecting face to provide a light emitting device with good visibility.

The light emitting device of Embodiment 1 described above can effectively reduce light leakage from the interface between the first reflector 5 and the second reflector 7 because a difference in level is created between the first bottom face 5a and the second bottom face 5b of the first reflection member 5.

Here, the difference in level created between the first bottom face 5a and the second bottom face 5b is preferably in a range between about 1 µm and about 1000 µm, more preferably in a range between about 10 μm and about 200 μm, yet more preferably in a range between about 30 μm and about 100 μm, in order to enhance the bonding strength between the first reflector 5 and the second reflector 7, and effectively reduce light leakage from the interface between the first reflector 5 and the second reflector 7. In other words, the difference in level created between the first bottom face 5a and the second bottom face 5b represents the height of the inner circumferential faces 5c.

The thickness of the light transmissive member 3, moreover, is preferably in a range between about 10 μm and about 500 μm. The thickness of the first reflector 5 where there is no difference in level (that is, the thinner portion) is preferably substantially the same as the thickness of the light transmissive member 3, i.e., in a range between about 10 μm and about 500 μm. This can construct a light emitting device having even better visibility.

With respect to the light emitting device of Embodiment 1 described above, FIG. 2 shows an example in which the light transmissive member 3 has a flat surface 3s, which is the light ejecting face. However, the light emitting device is not limited to those having a flat light ejecting face, and may have a concave or convex surface. The light ejecting face may also be an irregular surface.

The light emitting device of Embodiment 1 constructed as above can be manufactured by the manufacturing method described below, and thus can be manufactured inexpensively.

The light emitting device of Embodiment 1 constructed as above can be manufactured by the manufacturing method described below. Thus, by allowing the light transmissive member 3 to contain a phosphor, light emitting devices containing various phosphors can be produced.

Manufacturing Method for the Light Emitting Device According to Embodiment 1

The method for producing the light emitting device according to Embodiment 1 includes a preparing baseplate, forming a first reflector, forming a light transmissive member, mounting a light emitting element, forming a second reflector, and dicing (separating). In this manufacturing method, forming first reflector and forming light transmissive member are performed on the baseplate 20 prepared by the baseplate preparation step.

Preparing Baseplate

In the manufacturing method of Embodiment 1, in the baseplate preparation step, a baseplate 20 having protrusions 21a in the areas corresponding to the positions at which light emitting elements will be disposed is prepared. The protrusions 21a are formed on a plate surface 21 of the baseplate 20. The baseplate 20, for example, is made of a metal, such as SUS, and the protrusions 21a are formed by machining the plate surface. The shape of the protrusion 21a is determined based on the shape of the light emitting element 1, and for example, the upper face of the protrusion is formed slightly larger than the upper face shape of the light emitting element 1 for easily mounting the light emitting element 1.

The baseplate can be used repeatedly, and thus the baseplate preparation step is not something that is always required before the first reflector forming step.

Forming First Reflector

Figure 7A:
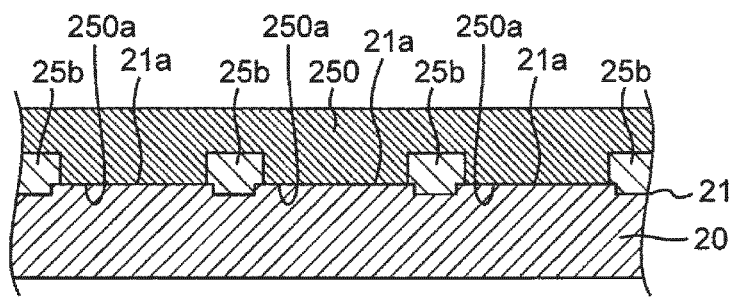
FIGS. 7A-7G are schematic sectional views explaining the manufacturing method for the light emitting device according to Embodiment 1.
Figure 7B:
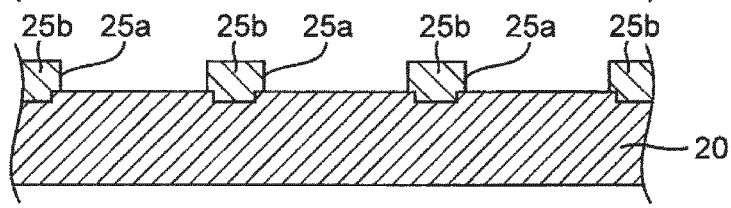

In the manufacturing method of Embodiment 2, in the first reflector forming step, as shown in FIG. 7A for example, a mold 250 is placed on the plate surface 21 side of the baseplate 20, and the first resin frames 25b each having an opening above the protrusion 21a are formed in a lattice pattern by transfer molding, injection molding, or the like. More specifically, a mold 250 having mold protrusions 250a located in correspondence with the protrusions 21a of the base plate 20 is placed so as to bring the upper faces of the mold protrusions 250a into contact with the upper faces of the protrusions 21a to create cavities having a matching shape to the first resin frame 25a at the periphery of the protrusions 21 and the mold protrusions 250a. The cavities are filled with a first resin containing a light reflecting substance, for example, and then cured. In this way, the first resin frames 25b are formed which will become the first reflectors 5 when separated into individual light emitting devices.

Figure 8A:
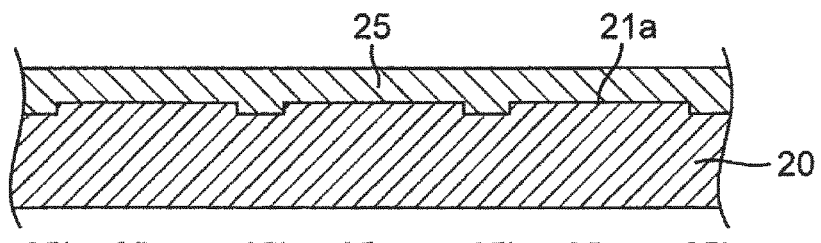
FIGS. 8A and 8B are schematic sectional views explaining the manufacturing method for a variation of the light emitting device of Embodiment 1.
Figure 8B:
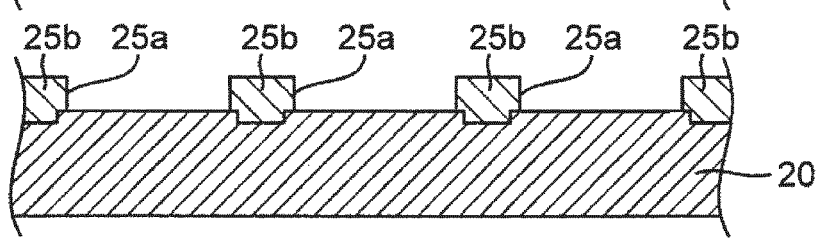

The first reflector forming step may be adapted to form and cure the first resin layer 25 on the entire baseplate surface 21 without using a mold 250, as shown in FIG. 8A, followed by forming the openings (opening forming step), as shown in FIG. 8B. In the opening forming step, an opening 25a is formed in the cured first resin layer 25 above each protrusion 21a. The openings 25a are formed to expose the protrusions 21a at the bottom of the openings 25a and to the shape corresponding to the light transmissive members 3.

The openings 25a can be formed by, for example, blasting, lasing, or the like.

Forming Light Transmissive Member

In the manufacturing method of Embodiment 1, the light transmissive member forming step, if forming a phosphor-containing light transmissive member 3, for example, includes a second resin layer forming step, a phosphor sedimentation step for settling the phosphor by, for example, centrifugation, and a second resin layer curing step.

Figure 7C:
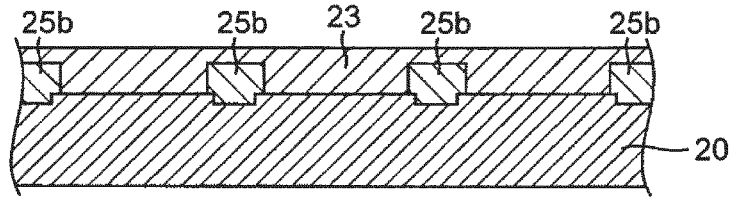
Figure 7D:
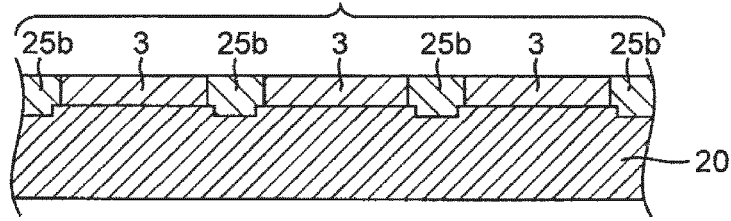

In the second resin layer forming step, as shown in FIG. 7C, the second resin layer 23 is formed by applying, for example, a phosphor-containing second resin so as to fill the openings 25a and cover the first resin frames 25b by, for example, potting.

In the phosphor sedimentation step, the phosphor particles contained in the second resin layer 23 are settled towards the baseplate 20 side by rotating the second resin layer 23 together with the baseplate 20 around the axis of rotation which is in parallel with the baseplate 20 and located above the second resin layer 23 opposite the baseplate 20. for example.

In the second resin layer curing step, the second resin layer 23 is cured in the state in which the phosphor particles are settled to the baseplate 20 side. According to the light transmissive member forming step described above, light emitting devices can be produced using various phosphors.

Moreover, in the cases where the second resin layer 23 is formed to fill the openings 25a and cover the first resin frames 25b as shown in FIG. 7C, the light transmissive member forming step further can include a removing step after curing the second resin layer 23. In the removing step, as shown in FIG. 71), the second resin layer 23 is ground from the upper face, for example, so as to reduce the second resin layer 23 filling the openings 25a to a given thickness and to remove the second resin layer 23 disposed on the first resin frames 25b.

The light transmissive member forming step may be adapted so as to form the second resin layer 23 of a prescribed thickness in each opening 25 without forming the second resin layer 23 on the first resin frames 25b by filling each opening 25a with a prescribed amount of the second resin layer 23. In this case, the removing step may not needed.

Mounting Light Emitting Element

In the manufacturing method of Embodiment 1, the light emitting element mounting step may include a baseplate detaching step, a die bonding step, and as needed, a reinforcing sheet attaching step before the baseplate detaching step. The explanation below includes the reinforcing sheet attaching step.

In the reinforcing sheet attaching step, a reinforcing sheet 40 is attached to the light transmissive member 3 composed of a second resin layer formed on the first resin frames 25b and the openings 25a. The reinforcing sheet 40 strengthens the combination sheet 30 composed of the first resin frames 25b and the light transmissive member 3 retained by the first resin frames 25b.

In the baseplate detaching step, the baseplate 20 is detached from the combination sheet 30 reinforced by the reinforcing sheet 40. When the baseplate 20 is detached, recesses 30a corresponding to the protrusions 21 of the baseplate 20 appear on the combination sheet 30. The bottom face of each recess 30a includes the lower face of the light transmissive member 3 and the second bottom face 5b exposed in the surrounding of the lower face. In the surrounding of the recesses 30a, the first bottom faces 5a are also exposed.

Figure 7E:
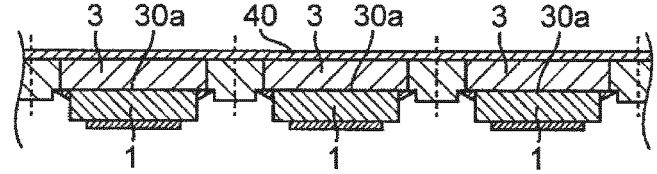

In the die bonding step, as shown in FIG. 7E, a light emitting element 1 is bonded to the bottom face of each recess 30a using a die bonding resin. The die bonding resin is made of, for example, a light transmissive resin, and a die bonding resin layer is formed between the light emitting element 1 and the light transmissive member 3, and the oblique portions 9 made of the die bonding resin are formed in the surrounding of the light emitting element 1. For effective extraction of light via the light transmissive member 3, the light emitting element 1 is preferably bonded to the lower face of the light transmissive member 3 without extending onto the second bottom face 5b. The light emitting element 1 is preferably mounted so as to be surrounded by the oblique portions 9 made of the die bonding resin within the recess 30a. By forming the oblique portions 9 to allow their one end to reach the lateral walls of the recess 30a, the oblique portions 9 can straddle the light transmissive member 3 and the first resin frame 25b. This can spread the oblique portions 9 across the entire lower face of the light transmissive member 3, enabling light to enter across substantially the entire surface of the light transmissive member 3. This can reduce luminance irregularities at the emission face.

Forming Second Reflector

In the manufacturing method of Embodiment 1, the second reflector forming step may include a third resin forming step and a third resin layer grinding step.

Figure 7F:
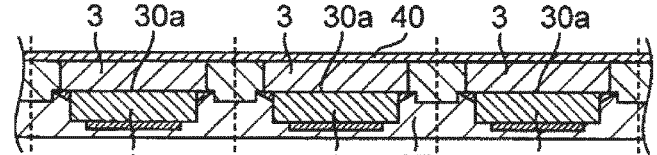

In the third resin forming step, as shown in FIG. 7F, a third resin 27 containing a light reflecting substance, for example, is formed to cover the light emitting elements 1 individually mounted in the recesses 30a and to be in contact with the second bottom faces 5b. It is preferable to form the third resin 27 so that the third resin fills recesses 30a in the surrounding of the light emitting elements 1 as well as contacting the oblique portions and the lateral walls of the recesses 30a. This can securely bond the first resin and the second resin together.

In the third resin layer grinding step, the third resin 27 is ground from the lower face to expose the electrodes 13 and 14 of the light emitting elements.

Separating

Figure 7G:
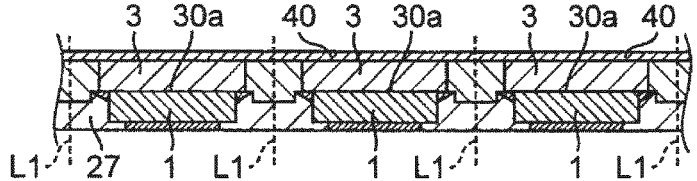

In the separating step, the light emitting devices may be separated into individual pieces by cutting the first resin and the third resin along the dividing lines L1 indicated in FIG. 7G by dicing, or the like, after detaching the reinforcing sheet or cutting together with the reinforcing sheet.

In the manner described above, the light emitting device of Embodiment 1 shown in FIGS. 1-3 can be produced.

Light Emitting Device According to Embodiment 2

Figure 4:
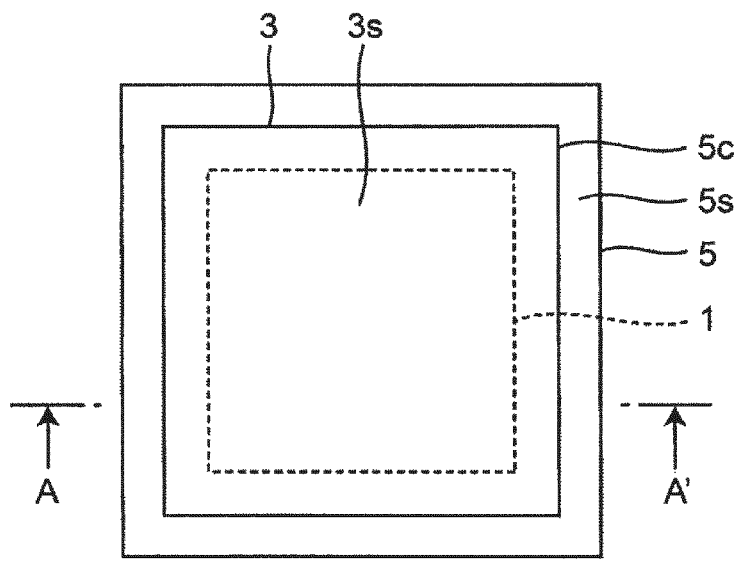
FIG. 4 is a schematic top view of the light emitting device according to Embodiment 2.
Figure 5:
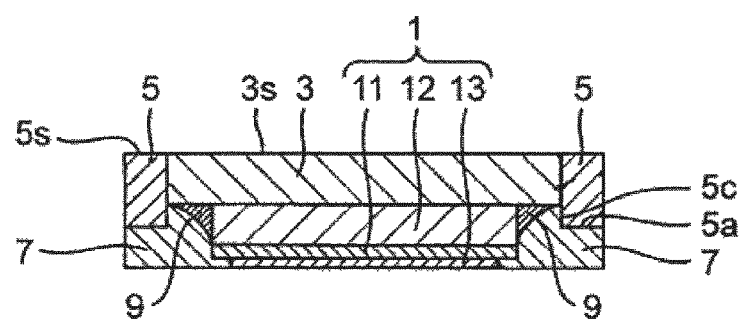
FIG. 5 is a schematic sectional view along line A-A' indicated in FIG. 4.
Figure 6:
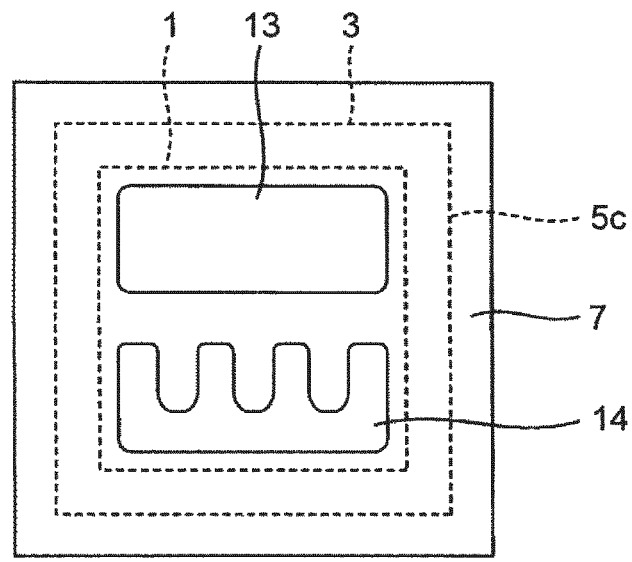
FIG. 6 is a schematic bottom view of the light emitting device according to Embodiment 2.

The light emitting device of Embodiment 2, as shown in FIGS. 4-6, differs from the light emitting device of Embodiment 1 such that the inner circumferential faces of the first reflector 5 in contact with the light transmissive member 3 continuously extend to the first bottom face 5a without a difference in level. The light emitting device of Embodiment 2 described above can more effectively extract via the light transmissive member 3 the light reflected by the interfaces between the oblique portions 9 made of a light transmissive resin and the second reflector 7, further increasing the light extraction efficiency.

Light Emitting Device According to Embodiment 3

Figure 9:
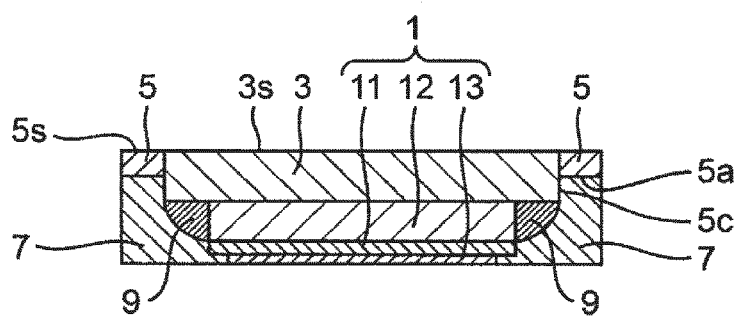
FIG. 9 is a schematic sectional view of the light emitting device according to Embodiment 3.
Figure 10A:
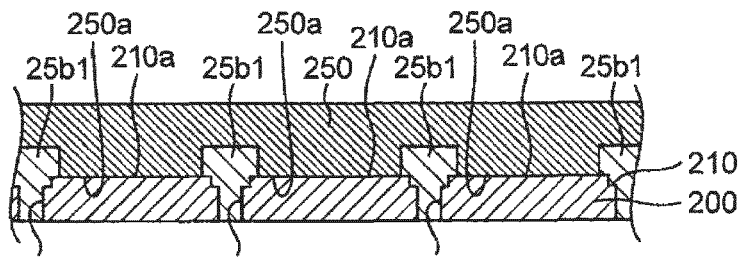
FIGS. 10A-10G are schematic sectional views explaining the manufacturing method for the light emitting device according to Embodiment 4.
Figure 10B:
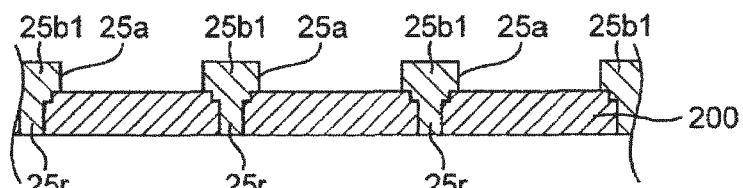
Figure 10C:
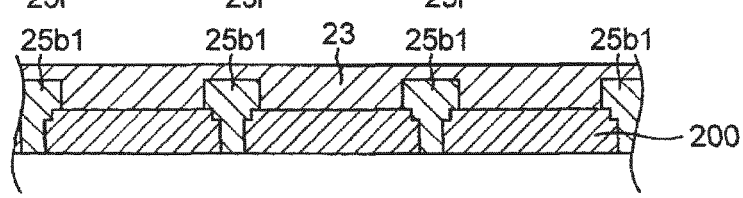
Figure 10D:
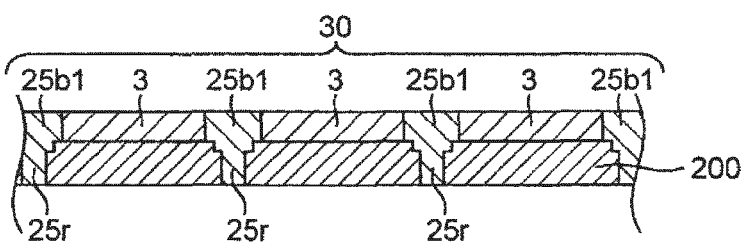
Figure 10E:
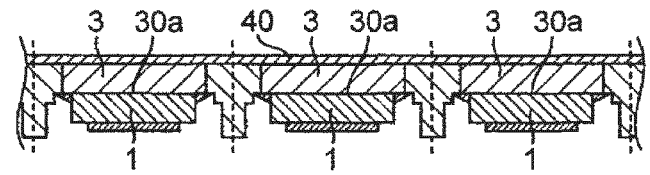
Figure 10F:
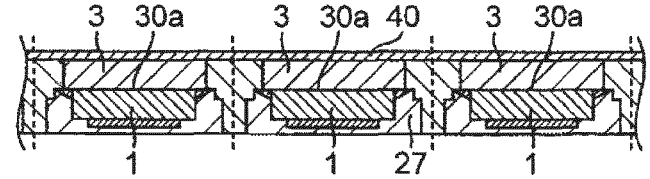
Figure 10G:
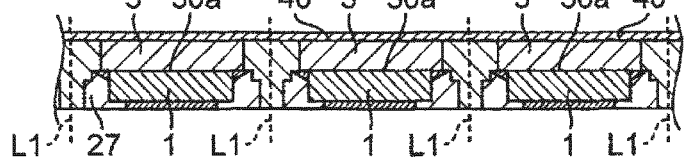

The light emitting device of Embodiment 3, as shown in FIG. 9, differs from the light emitting device of Embodiment 2 such that the first reflector 5 has the first bottom face 5a that is higher than the lower face of the light transmissive member 3. In other words, the lateral faces of the light transmissive member 3 are covered by both the first reflector 5 and the second reflector 7. The light emitting device of Embodiment 3 described above can effectively reduce light leakage from the interface between the first reflector 5 and the second reflector 7 because a difference in level is created between the first bottom face 5a of the first reflector 5 and the lower face of the light transmissive member 3 which is the bonding face for the light emitting element 1 and the light transmissive member 3.

Manufacturing Method for Light Emitting Device According to Embodiment 4

The manufacturing method for the light emitting device according to Embodiment 4, as compared to the manufacturing method for the light emitting device according to Embodiment 1, employs a baseplate 200 having a different shape from the baseplate 20 employed in the manufacturing method of Embodiment 1 as shown in FIGS. 10A-10G. The method is otherwise similar to the production method of Embodiment 1.

More specifically, in the manufacturing method for the light emitting device of Embodiment 4, the baseplate 200 has through holes 220 which provide, for example, cylindrical cavities, and the through holes 220 are disposed, for example, between diagonally adjacent protrusions 210a. In other words, in the baseplate 200, a plurality of rectangular protrusions 210a, for example, are formed in rows and columns at the baseplate surface 210, wherein the protrusions 210a and the through holes 220 are alternately provided in diagonal directions in the plan view.

In the manufacturing method for the light emitting device of Embodiment 4 employing such a baseplate 200, when forming the first resin frames 25b1, the through holes 220 are also filled with the first resin. This forms, for example, cylindrical ribs 25r corresponding to the shape of the through holes 220 at the first resin frames 25b1. Subsequently, in similar manner to in Embodiment 1, the baseplate 200 is detached after forming the light transmissive members 3.

In the manufacturing method for the light emitting device of Embodiment 4 described above, since the ribs 25r are formed through the through holes 220, the first resin frames 25b1 can be easily detached from the baseplate 200 by pushing the ribs 25r while securing the baseplate 200 in place.

Figure 11:
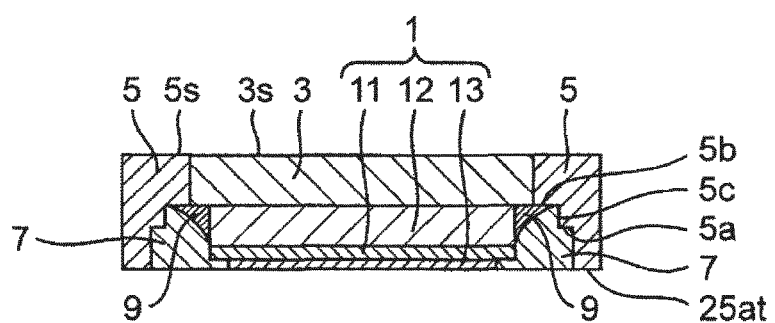
FIG. 11 is a schematic sectional view of the light emitting device of Embodiment 4.

The light emitting device produced by the above manufacturing method of Embodiment 4, as shown in FIG. 11, is similar to the light emitting device of Embodiment 1 except that a portion of the end face 25at of the rib 25a positioned lower than the first bottom face 5a is exposed and is substantially coplanar with the bottom face of the second reflector 7, and has similar functional effects to those of the light emitting device of Embodiment 1.

Now, the sectional view shown in FIG. 11 is a cross section near a lateral face in order to show a portion of the rib 25a on each side, but a cross section of the light emitting device closer to the center than that shown in FIG. 11 is similar to that shown in FIG. 2. The same is true for FIGS. 10A-10G.

Materials for each member included in the light emitting devices according to the embodiments will be explained below.

Light Emitting Element 1

For the light emitting element 1, a semiconductor light emitting element, such as a light emitting diode chip, can be used. The semiconductor light emitting element may include a light transmittive substrate 12 and a semiconductor stack 11 formed thereon.

Light Transmittive Substrate 12

For the light transmittive substrate 12, for example, a light transmissive insulating material, such as sapphire ($Al_2O_3$) or spinel ($MgAl_2O_4$), or a semiconductor material that allows the emitted light from the semiconductor stack 11 to transmit therethrough (e.g., a nitride-based semiconductor material) can be used.

Semiconductor Stack 11

The semiconductor stack 11 includes, for example, plural semiconductor layers, such as an n-type semiconductor layer, an emission layer (that is, active layer), and a p-type semiconductor layer. The semiconductor layers can be formed using semiconductor materials, such as group III-V compound semiconductors, group II-VI compound semiconductors, or the like. More specifically, a nitride-based semiconductor material, such as an $In_XAl_YGa_{1-X-Y}N$ ($0 \leq X$, $0 \leq Y$, $X+Y \leq 1$) or the like (e.g., InN, AlN, GaN, InGaN, AlGaN, InGaAlN, or the like) can be used.

Electrodes 13 and 14

For the electrodes 13 and 14 of the light emitting element 1, a good conductor of electricity can be used, and for example, a metal such as Cu is suitable.

Light Transmissive Resin Used as Light Guiding Member

For the light transmissive resin, particularly, thermosetting light transmissive resins, such as silicone resins, silicone modified resins, epoxy resins, and phenol resins can be used.

Moreover, since the light transmissive resin is in contact with the lateral faces of the light emitting element 1, it may be affected by the heat generated at the light emitting element 1 when turned on. In this regard, thermosetting resins with highly heat resistant are suited for the light transmissive resin.

First Reflector 5 and Second Reflector 7

The first reflector 5 and the second reflector 7 can be constructed with a light reflecting resin. A light reflecting resin means a resin having a high reflectance, for example, a reflectance of 70% or higher, relative to the light from the light emitting element.

For the light reflecting resin, for example, a light transmissive resin in which light reflecting substance is dispersed can be used. Examples of suitable light reflecting substances include titanium oxide, silicon dioxide, titanium dioxide, zirconium dioxide, potassium titanate, alumina, aluminum nitride, boron nitride, and mullite. A light reflecting substance in granular, fibrous, or thin flake form can be used. The fibrous form is preferable as it can reduce the coefficients of thermal expansion of the first reflector 5 and the second reflector 7 thereby reducing, for example, the differences in the thermal expansion coefficient between these and the light emitting element 1. For the resin material used as the light reflecting resin, thermosetting light transmissive resins, such as silicone resins, silicone modified resins, epoxy resins, and phenol resins are preferable.

Light Transmissive Member 3

For the light transmissive resin used in the light transmissive member 3, thermosetting resins, such as silicone resins, silicone modified resins, epoxy resins, and phenol resins, and thermoplastic resins, such as polycarbonate resins, acrylic resins, methylpentane resins, and polynorbornene resins can be used. Particularly, silicone resins which have highly light resistant and highly heat resistant are suitable.

Phosphor

Phosphors that can be excited by the emitted light from the light emitting element 1 are used. as the wavelength converting substance Examples of phosphors excitable by light emits from a blue light emitting element or ultraviolet light emitting element include cerium-activated yttrium aluminum garnet-based phosphors (Ce:YAG); cerium-activated lutetium aluminum garnet-based phosphors (Ce:LAG); europium- and/or chromium-activated nitrogen-containing calcium aluminosilicate-based phosphors ($CaO-Al_2O_1-SiO_2$); europium-activated silicate-based phosphors (($Sr,Ba)_2SiO_4$); nitride-based phosphors, such as $\beta$-SiAlON phosphors, CASN-based phosphors, SCASN-based phosphors; KSF-based phosphors ($K_2SiF_6$:Mn); sulfide-based phosphors, and quantum dot phosphors. By combining these phosphors with a blue or ultraviolet light emitting element, light emitting devices of various emission colors (e.g., a white light emitting device) can be produced.

Several embodiments of the invention have been exemplified in the forgoing. It goes without saying, however, that the invention is not limited to those described above, and can be any given device so long as it does not deviate from the spirit and the scope of the invention.

What is claimed is:

1. A light emitting device comprising:
   a light emitting element having an upper face and lateral faces;
   a light transmissive member covering at least a portion of the upper face of the light emitting element and transmitting light emitted from the light emitting element;
   a first reflector surrounding outermost lateral faces of the light transmissive member in a plan view; and
   a second reflector covering the lateral faces of the light emitting element;
   wherein the first reflector includes a first bottom face and a second bottom face,
   wherein a plane in which the first bottom face of the first reflector extends is different than a plane in which a lower face of the light transmissive member extends,
   wherein the second bottom face of the first reflector is located inward of the first bottom face of the first reflector, and is coplanar with the lower face of the light transmissive member, and
   wherein the first bottom face of the first reflector is covered by and in contact with the second reflector.

2. The light emitting device according to claim 1, wherein the first bottom face of the first reflector is positioned lower than the lower face of the light transmissive member.

3. The light emitting device according to claim 1, wherein the first bottom face of the first reflector is positioned higher than the lower face of the light transmissive member.

4. The light emitting device according to claim 3, wherein the lateral faces of the light transmissive member are covered by the first reflector and the second reflector.

5. The light emitting device according to claim 1, wherein the difference in level between the first bottom face and the second bottom face is in a range between 30 μm and 100 μm.

6. The light emitting device according to claim 1, wherein the light emitting element is bonded to the light transmissive member via a bonding material.

7. The light emitting device according to claim 6, wherein the second reflector is in contact with the bonding material.

8. The light emitting device according to claim 6,
the first reflector further includes a third bottom face which is substantially coplanar with a lower face of the second reflector.

9. The light emitting device according to claim 1, wherein an upper face of the light transmissive member is planar, the lower face of the light transmissive member is planar, and the outermost lateral faces of the light transmissive member are planar.

10. The light emitting device according to claim 1, wherein an upper face of the light emitting device is formed solely by an upper face of the light transmissive member and an upper face of the first reflector.

11. The light emitting device according to claim 1, wherein the first reflector contacts an entirety of the outmost lateral faces of the light transmissive member.

* * * * *